United States Patent [19]

Peitz, Jr.

[11] Patent Number: 4,916,331
[45] Date of Patent: Apr. 10, 1990

[54] SYNCHRONIZED INPUT LATCH CIRCUIT WITH CONDITIONING CIRCUITS FOR AC INPUTS

[75] Inventor: Robert W. Peitz, Jr., Fayetteville, N.Y.

[73] Assignee: Carrier Corporation, Syracuse, N.Y.

[21] Appl. No.: 224,829

[22] Filed: Jul. 27, 1988

[51] Int. Cl.⁴ .................... H03K 5/153; H03K 17/56; H03K 5/08; H03K 17/00
[52] U.S. Cl. .................................. 307/269; 307/361; 307/364; 307/241; 307/242; 307/243; 328/28; 328/104; 328/116; 328/179; 328/154; 328/63; 328/72
[58] Field of Search ............... 307/360, 361, 364, 289, 307/241, 242, 243, 269; 328/28, 104, 105, 116, 179, 154, 63, 72

[56] References Cited

U.S. PATENT DOCUMENTS

| | | | |
|---|---|---|---|
| 4,638,181 | 1/1987 | Deiss .................................. | 307/243 |
| 4,692,633 | 9/1987 | Ngai et al. ............................. | 328/63 |
| 4,713,623 | 12/1987 | Mower et al. ......................... | 328/72 |
| 4,726,015 | 2/1988 | Nirschl ................................. | 328/104 |
| 4,766,602 | 8/1988 | Wilkinson et al. ................... | 328/72 |

Primary Examiner—Stanley D. Miller
Assistant Examiner—Trong Quang Phan
Attorney, Agent, or Firm—Bernhard P. Molldrem, Jr.

[57] ABSTRACT

An AC input conditioning circuit comprises a latch circuit, one or more latch conditioning channels, and a latch synchronizing circuit that is coupled to an AC source and has an output supplying a latch enable pulse to the latch enable terminal of the latch circuit only when the AC power signal exceeds predetermined latching threshold during alternate half cycles. The conditioning channel comprises an input coupled to a device whose on or off sense is to be detected, and an output coupled to a corresponding channel of the latch. Each conditioning channel can be comprised of a rectifier diode, followed by a zener diode and a driver amplifier.

7 Claims, 4 Drawing Sheets

SYNCHRONIZED INPUT LATCH CIRCUIT WITH CONDITIONING CIRCUITS FOR AC INPUTS

BACKGROUND OF THE INVENTION

This invention relates to input conditioning circuits for reading the status of AC or DC inputs, and is especially directed to an AC synchronized input conditioning circuit which could be employed with a microprocessor-controlled thermostatically actuated device, such as a gas-fired condensing furnace.

Typically, modern heating equipment is controlled and actuated by a 24-volt AC thermostat and a number of additional switches for auxiliary equipment, such as a humidifier. The condition of a number of switches and loads must be sensed and fed to the microprocessor via a microprocessor data bus. The thermostat typically also has a rechargeable battery which is charged from the 24-volt AC thermostat power, so the conditioning circuit must be capable of sensing on and off conditions for both AC and DC loads, which may or may not be similarly grounded. The conditioning circuit should also have a high capability for AC line noise rejection, and quick responsiveness, preferably within one or two cycles of the AC power.

Low-pass filters or Resistor-Capacitor-Diode rectifying and integrating circuits have been employed to sense whether a voltage is being applied to a load, or to sense whether a switch is closed or open. Two problems arise from this approach. First, because of the time required to charge their capacitors, these circuits have a rather long response time and would be incompatible with the rather fast electronic furnace control algorithm of the furnace control microprocessor. Second, when a switch is open, a voltage passes through the load 180 degrees out of phase and of a low level. This AC voltage proceeds through the diode to charge the capacitor of the low pass filter circuit. Consequently, the circuit provides a high signal, indicating a positive "on" value even when the associated switch is open.

To avoid the above problems, it has been proposed to employ analog-to-digital converters or voltage dividers, which would have to be externally synchronized with line voltage, and which would rely on a microprocessor. The latter was intended to perform the required synchronization activity. This proposal was rather too costly for the function performed, as the resources could be better employed for system control.

OBJECTS AND SUMMARY OF THE INVENTION

Accordingly, it is an object of this invention to provide a microprocessor-bus-compatible line-synchronized circuit which avoids the drawbacks of the devices previously proposed.

It is another object of this invention to provide an input signal conditioning and line synchronizing circuit which is formed of a network of simple, inexpensive, and readily available components.

It is a further object of this invention to provide a circuit which is cost-competitive with previous AC input circuits, while providing superior performance.

In accordance with an aspect of this invention a microprocessor-bus-compatible latch is clocked by an AC line synchronization circuit and has input signal conditioning carried out by a network of resistors, diodes, and amplifiers.

The latch has at least one latch channel, each with an output and an input, and has a latch enable terminal. Preferably a transparent latch is employed, but other latches, such as a D-type latch could be used. Each latch channel latches and holds the state of the associated input in response to a latch enable signal applied to the latch enable terminal. For example, latching can occur when the voltage at the latch enable terminal goes low.

The latch synchronizing circuit has an input connected to the AC line power source, and an output connected to the latch enable terminal to apply a latch enable signal that is synchronized to the positive (or alternatively to the negative) half-cycles of the AC power wave, so that the latch enable terminal is high only when the AC power exceeds a threshold during alternate half cycles.

For each latch channel of the latch there is an associated input signal conditioning channel that produces a signal which is of one sense (i.e., high or low) when the voltage at an associated switch or load devices exceeds a predetermined threshold, and otherwise is of the opposite, complementary sense (i.e., low or high).

The synchronizing circuit can be simply formed of a series circuit of a resistor, a rectifying diode and a zener diode, the latter establishing a latch threshold voltage. The input signal channels can likewise each include a rectifying diode and a zener diode connected in series, with the latter establishing a sensing or sampling threshold. These zeners should be selected with the latch threshold at a higher voltage than the sensing threshold, so that the associated on-off values are properly latched.

The latch is preferably a readily available, packaged integrated circuit, and the several sensing circuits are likewise preferably formed using a readily available integrated circuit, such as a peripheral driver array which includes zener diodes and Darlington amplifiers, in series, in a number of channels.

The above and many other objects, features, and advantages of this invention will be more fully understood from the ensuing description of a preferred embodiment when considered in connection with the accompanying Drawing.

DETAILED DESCRIPTION OF THE PREFERRED EMBODIMENT

Figure 1:
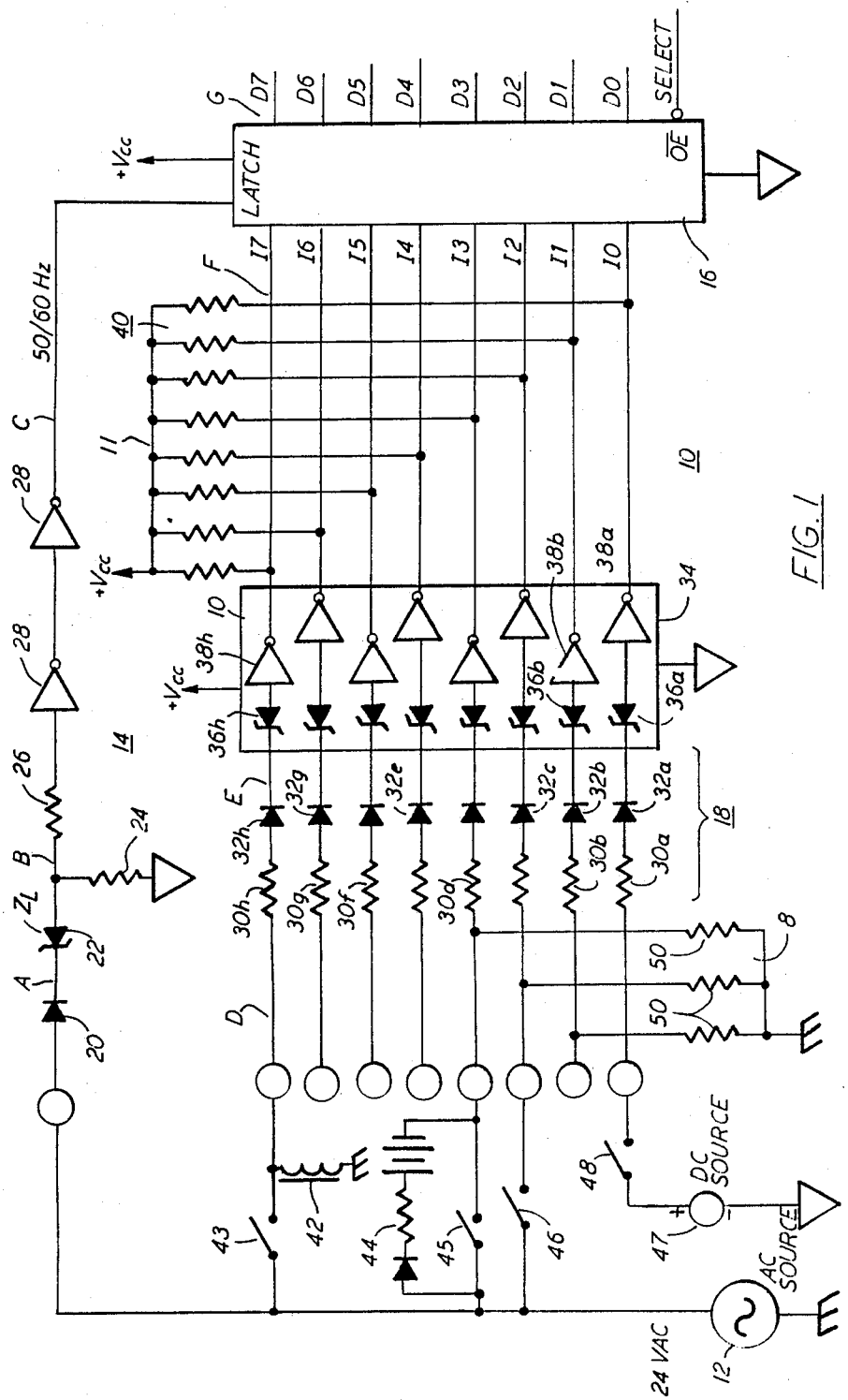
FIG. 1 is a schematic circuit diagram of an AC line-synchronized signal conditioning circuit according to a preferred embodiment of this invention.

With reference to the Drawing, and initially to FIG. 1 thereof, an AC-synchronized input latch circuit 10 is shown to be employed in connection with a source 12 of twenty-four volts alternating current, typically 50 Hz or 60 Hz, as is conventionally applied to the thermostat control circuitry of heating and air conditioning equipment. An AC synchronizing circuit 14 connects the source 12 with a latch enable input terminal LATCH of a multiple channel transparent latch circuit 16. The latch circuit 16 has eight inputs $I_0$ to $I_7$, and eight outputs $D_0$ to $D_7$. A sense signal conditioning circuit 18 has an associated eight channels, each of which is capable of sensing an on or off condition of a load to which a voltage, either AC or DC, may be applied. Each channel of the conditioning circuit 18 generates a sense signal which is of one sense, i.e., high or low, when the voltage at the associated sampling channel input exceeds high or low, when the voltage at the associated sampling channel input exceeds a predetermined threshold, and is of the complementary sense, i.e., low or high, otherwise. The output of each channel is applied to a corresponding input $I_0$ to $I_7$ of the latch circuit 16.

Figure 2A:
FIGS. 2A to 2I are signal diagrams for explaining the operation of the preferred embodiment.
Figure 2B:
Figure 2C:
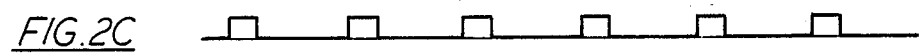

The synchronizing circuit 14 provides a latching signal to the terminal LATCH only when the AC power wave from the source 12 exceeds a predetermined latching threshold during alternate half cycles. To accomplish this, in this embodiment the synchronizing circuit is formed of a rectifying diode 20 which passes only the positive half cycles (FIG. 2A) of the power wave. This diode is followed by a zener diode 22 which has a zener voltage $V_{Z1}$. This element passes only that part of the AC wave half-cycle that exceeds this zener voltage $V_{Z1}$ as shown in FIG. 2B. A load resistor 24 permits sufficient current to flow through the zener diode 22 for proper zener voltage regulation. Another resistor 26 limits current flow into a gate circuit formed of a series pair of inverters 28,28. This twin-inverter gate conditions the input signal by squaring the AC line pulse, and provides hysteresis for line noise rejection. The resulting square signal (FIG. 2C) is fed to the latch enable terminal LATCH to synchronize the latch circuit 16 so as to capture the AC input status.

The input sense signal conditioning circuit 18 comprises eight parallel circuits formed of input resistors 30a–30h followed by respective rectifying diodes 32a–32h which pass only the positive half waves of the corresponding input signals. These diodes 32a–32h are connected to respective inputs of a multi-channel driver circuit 34. The latter can basically be considered as being composed of eight channels each having an input zener diode 36a–36h followed by a driver amplifier 38a–38h. The zener diodes 36a–36h have a threshold zener voltage $V_{Z2}$ which is lower than that of the zener diode 22.

The outputs of the driver circuit 34 are connected to respective inputs $I_0$ to $I_7$ of the latch circuit 16. As need be, a pull-up resistor array 40 can provide suitable DC conditions between the outputs of the driver circuit 34 in the inputs of the latch circuit 16.

Figure 3:
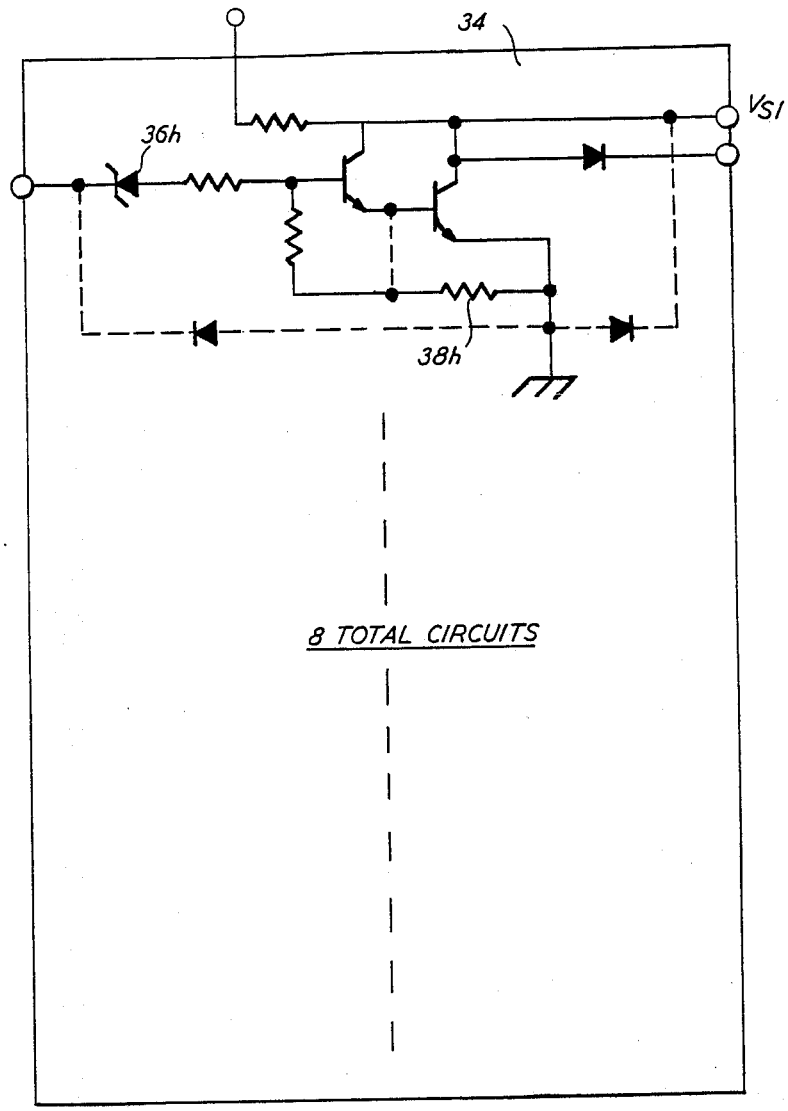
FIG. 3 is a simplified diagram illustrating details of one element of this embodiment.

As shown in FIG. 3, the driver circuit 34 can have its respective channels formed of Darlington transistor amplifiers 38h following the associated zener diode 36h. It has been found that a standard peripheral driver array (for example, a Motorola MC1412) is quite suitable for this purpose.

Figure 2D:
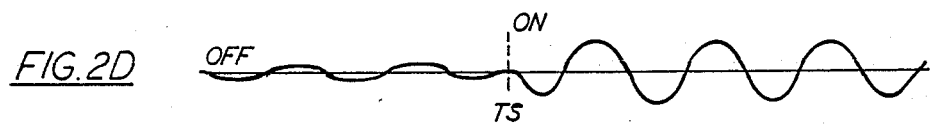
Figure 2E:
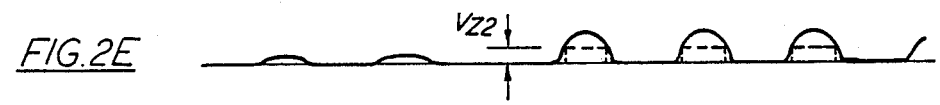
Figure 2F:
Figure 2G:

Returning to FIG. 1, a typical element whose condition must be sensed for proper control can be a switched inductive load 42, e.g., a primary winding of a transformer, and in this case the same is connected to the input resistor 30h. In this example, the switch 43 closes at a time $T_S$ as illustrated in FIG. 2D. Prior to that time, a reverse AC is sensed through the inductive element and appears 180 degrees out of phase with the voltage from the source 12. Then, after time $T_S$, the voltage applied through the switch appears at the input resistor 30h, and is in phase with the AC source voltage. The half-wave rectified voltage appearing at the cathode side of the diode 32h is illustrated in FIG. 2E. This voltage is then supplied through the zener diode 36h and driver amplifier 38h of the driver circuit 34 to produce a square pulse signal as shown in FIG. 2F. Here, there is a negative logic or negative "true" where a "low" value will indicate that the switch 43 is closed. Note that the low-going pulses prior to the time $T_S$ are out of synchronization with the latch pulses of FIG. 2C. Consequently, the corresponding latch output signal of FIG. 2G at the output terminal $D_7$ of the latch circuit 16 is not affected and remains high. However, after the time $T_S$ the negative or low state of the pulses of FIG. 2F are captured by the synchronizing latch pulse of FIG. 2C, and the latch output $D_7$ goes to a low value. As the data are "negative true" in the logic sense, a "0" or low logic level received by the microprocessor will indicate that the associated input is "on". A separate debouncing circuit or a simple debounce algorithm in the associated microprocessor can be employed.

Typically, the threshold values $V_{Z2}$ of the zener diodes 36h are 7.5 volts while the zener voltage $V_{Z1}$ of the zener diode 22 is about 18 volts.

In addition, another channel of the conditioning circuit 18 can be connected to a thermostat power supply 44 in which a rechargeable battery is recharged whenever a switch 45 thereof is open. Here, when the switch 45 is open a small phase-inverted AC voltage signal is present at the input resistor 30d.

Another channel can be connected to monitor a switch 46 connected to the AC source 12, and yet another channel can be connected to monitor a switch 48 coupled to a DC source 47 directly. Here, resistive loads 50 can be connected to provide suitable sampling voltages for the respective channels. The load resistors 50 eliminate dry circuit conditions on unloaded switches or contacts.

A low signal to the output-enable pin OE of the latch circuit 16 connects the latch outputs $D_0$ to $D_7$ to the corresponding microprocessor data bus. There the associated microprocessor (not shown) reads the latched data and performs any necessary contact bounce filtering.

Figure 2H:
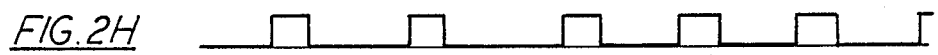
Figure 2I:
Figure 4:
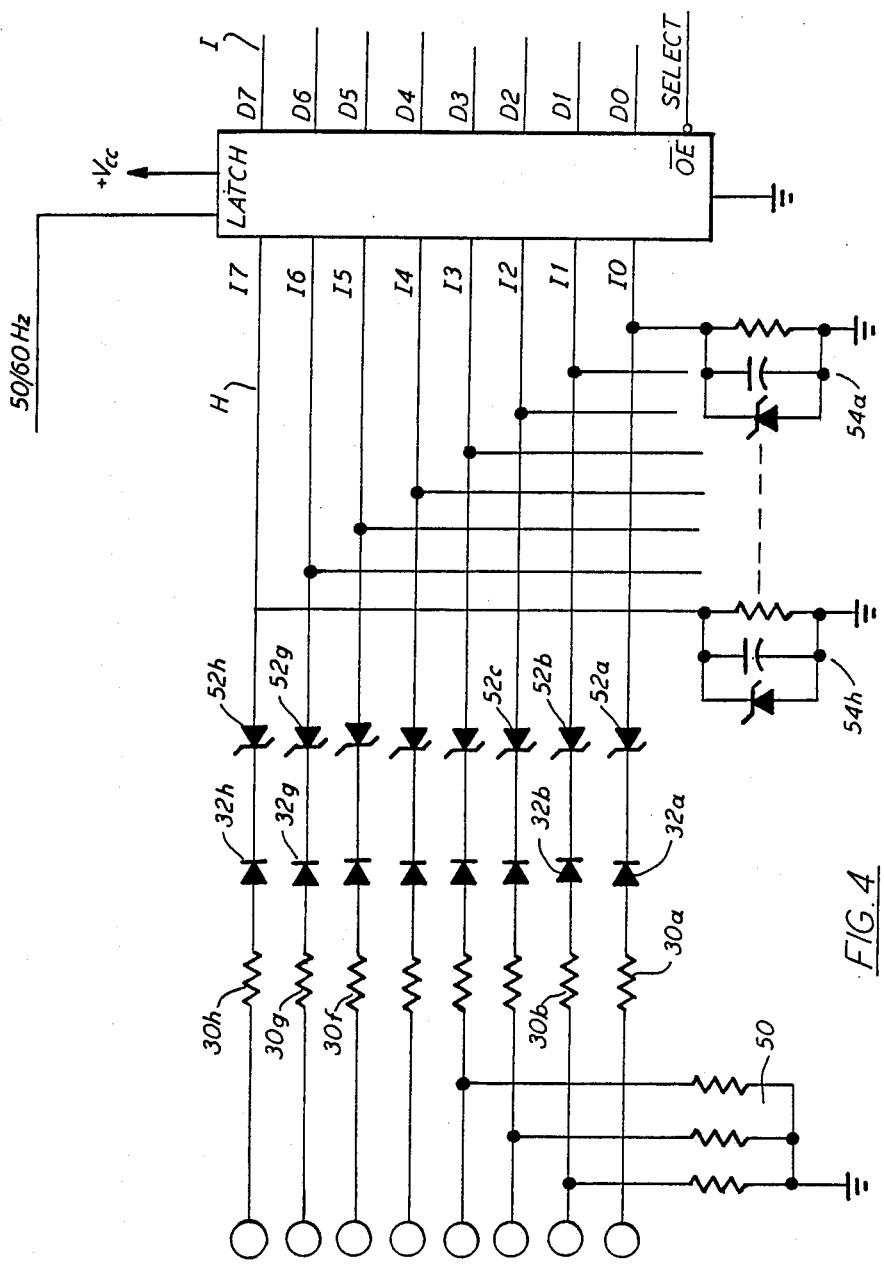
FIG. 4 is a partial schematic circuit diagram illustrating a second preferred embodiment of this invention.

An alternative embodiment is shown in FIG. 4, in which corresponding elements are identified with the same reference numbers, and for which the detailed description is omitted. This embodiment is similar to the circuit shown in FIG. 1, except that the driver circuit 34 is replaced with individual discrete zener diodes 52a–52h. There are also associated noise or spike cancelling circuits 54a–54h. In this embodiment, a "positive true" logic sense is employed, with a "high" or "1" logic level being supplied to the associated microprocessor to indicate that the corresponding input is "on". That is, in this version, prior to the time $T_S$, the signal at the input $I_7$ of the latch circuit 16 will be as shown in FIG. 2H; and at the corresponding output $D_7$ thereof will appear, as illustrated in FIG. 2I. While this embodiment is shown to have eight inputs, the number of inputs that are handled can be changed simply by adding or deleting components, as necessary.

While this invention has been described in detail with respect to a preferred embodiment, it should be appreciated that the invention is not limited to that embodiment, and that many modifications and variations will present themselves to those of skill in the art without departing from the scope and spirit of this invention, as defined in the appended claims.

What is claimed is:

1. AC synchronized input conditioning circuit for detecting an electrical load condition for an electrical device, in which an AC power source applies to said device an AC power wave that has alternate positive and negative half cycles, the synchronizing circuit comprising:
   latching means having at least one latch with an input and an output, and a latch enable terminal, each of said at least one latch holding on its output the electrical state of the associated input during periods between successive enable signals applied to said latch enable terminal;
   latch synchronizing means having an input coupled to said AC source and an output coupled to said latch enable terminal for applying said latch enable signal to said terminal only when said AC power exceeds a predetermined latching threshold during alternate half cycles thereof; and
   at least one conditioning channel, each said channel having an input coupled to said device, sensing means for generating a sense signal which is of one binary sense when the voltage at the input of said channel exceeds a predetermined sampling threshold and is of a complementary binary sense otherwise, and an output supplying said sense signal to the associated latch input of said latching means.

2. AC synchronized circuit according to claim 1, wherein said latch synchronizing means includes a series circuit formed of a rectifying diode, followed by a zener diode establishing said predetermined latching threshold.

3. AC synchronized circuit according to claim 2, wherein said latch synchronizing means further includes a signal shaping circuit in series with said zener diode for producing a signal which is of one binary sense when said zener diode is conducting and is of another binary complementary sense otherwise.

4. AC synchronized circuit according to claim 2, wherein the predetermined latch threshold of said zener diode is higher than the predetermined sampling threshold of the sensing means.

5. AC synchronized circuit according to claim 1, wherein said at least one conditioning channel includes a multi-channel Darlington array that comprises a plurality of channels each having an input and an output and a series circuit therebetween including a zener diode followed by a driver amplifier.

6. AC synchronized circuit according to claim 5, wherein said at least one conditioning channel further includes respective rectifying diodes in series with said Darlington array channels permitting only current of one polarity to reach the associated zener diodes and amplifiers.

7. AC synchronized circuit according to claim 5, wherein each of said driver amplifiers is a Darlington amplifier.

* * * * *